United States Patent
Iida et al.

(10) Patent No.: US 6,359,424 B2
(45) Date of Patent: Mar. 19, 2002

(54) SWITCHING CIRCUIT FOR GENERATING PULSED POWER

(75) Inventors: Katsuji Iida, Nagoya; Tatsuhiko Hatano, Kasugai; Takeshi Sakuma; Wataru Shionoya, both of Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/788,312

(22) Filed: Feb. 16, 2001

(30) Foreign Application Priority Data

Feb. 21, 2000 (JP) ......................... 2000-042808

(51) Int. Cl.[7] ............... G05F 1/325; G05F 1/33; G05F 1/12
(52) U.S. Cl. .............. 323/251; 323/362; 323/328; 323/355
(58) Field of Search .................. 323/251, 250, 323/247, 328, 355, 362

(56) References Cited

U.S. PATENT DOCUMENTS

| | | | | |
|---|---|---|---|---|
| 5,365,421 A | * | 11/1994 | Eastham | 363/71 |
| 5,905,646 A | * | 5/1999 | Crewson et al. | 363/132 |
| 5,914,974 A | * | 6/1999 | Partlo et al. | 327/38 |
| 6,055,161 A | * | 4/2000 | Church et al. | 363/22 |

* cited by examiner

*Primary Examiner*—Bao Q. Vu
(74) *Attorney, Agent, or Firm*—Burr & Brown

(57) ABSTRACT

A switching circuit for generating pulsed power including a plurality of capacitors connected in parallel with first and second output terminals, a plurality of series circuits of a primary conductor and a static induction thyristor connected in parallel with respective capacitors, a plurality of magnetic cores with which the primary conductors are magnetically coupled, respectively, and a series arrangement of a plurality of secondary conductors each being magnetically coupled with respective magnetic cores, both ends of the series arrangement being connected to first and second output terminals, respectively.

12 Claims, 5 Drawing Sheets

SWITCHING CIRCUIT FOR GENERATING PULSED POWER

BACKGROUND OF THE INVENTION

1. Field of the Invention

The present invention relates to a semiconductor switching circuit generating a pulsed power of high voltage and large current.

2. Description of the Related Art

For generating plasma, a pulse having an abruptly raising edge, a very high peak voltage of ten and several kilo-volts to several hundreds kilo-volts and an extremely large current such as several thousands amperes.

FIG. 1 a conceptual circuit diagram showing a basic structure of such a discharge circuit. A capacitor C constituting an electrostatic capacitance for storing energy is charged by means of a current limiting element not shown within a time interval of millisecond order up to a high voltage $E_0$ of a high voltage supply source P. Then, a switching element SW performing a ultra-high switching operation is closed to discharge through a conductor having a very low inductance L and a high voltage is applied to a discharging portion H Heretofore, as the ultra high speed switching element SW, use has been made of a thyratron which is one of a vacuum tube and can operate under high voltage and large current. However, the thyratron has the following demerits.

(1) It could not operate at a high repetition frequency.
(2) Its operation is unstable due to miss-ignition.
(3) Its life time is short, its maintenance is cumbersome and requires high cost.
(4) Its construction is complicated due to heater circuit and gas controller.
(5) Due to jitter at turning-on operation, reliable operation could not attained.

Nowadays a semiconductor switching element has been well developed in accordance with the progress in the power electronics, and several kinds of semiconductor switching devices can operate at a high speed under high voltage and large current. Among these semiconductor switching devices, attention has been paid on a static induction thyristor (in general, referred to SI thyristor). However, the thyratron could not be replaced by the known SI thyristor, because a breakdown voltage of the SI thyristor is lower than that of the thyratron. Therefore, it has been proposed to use a series arrangement of a plurality of SI thyristors S-1, S-2 . . . S-n as shown in FIG. 2.

As stated above, in the known switching circuit for generating a pulsed power, it is necessary to use the DC voltage supply source P which could supply a high voltage, and therefore its size is liable to be large. Moreover, the capacitor C should have a high breakdown voltage, and thus it is liable to be large in size and expensive in cost. Furthermore, in case of using the series arrangement of a plurality of SI thyristors S-1, S-2 . . . S-n, the following problems occur.

Due to variation in characteristics, particularly in a leak current upon cutting-off an applied voltage of the semiconductor switching devices, voltages shared by respective semiconductor switching devices might be unbalanced. Then, there is a fear that excessive high voltage might be applied to one or more semiconductor switching devices. In order to mitigate such a drawback, it is necessary to select a number of semiconductor switching devices having identical characteristics. However, in practice, it is rather difficult to select semiconductor switching devices having identical characteristics.

As illustrated in FIG. 2, in order to mitigate or adjust unbalance between the semiconductor switching devices, i.e. SI thyristors S-1, S-2 . . . S-n in the series arrangement, balancer resistors R-1, R-2 . . . R-n are connected in parallel with respective SI thyristors. In this case, it is necessary to flow a current through the balancer resistors R-1, R-2 . . . R-n, said current being larger than a current flowing through the SI thyristors S-1, S-2 . . . S-n by about ten times. Therefore, very large energy loss occurs by the balancer resistors R-1, R-2 . . . R-n, and an efficiency of the circuit might be decreased to a large extent. There also occurs a problem of treating heat generated by the balancer resistors R-1, R-2 . . . R-n. Moreover, in the known circuit, there is a serious problem of unbalance of a transient voltage sharing upon a turn-on due to a variation in a stray capacitance of respective thyristors with respect to the ground.

If a trigger timing for respective thyristors S-1, S-2 . . . S-n fluctuates, an excessive high voltage is applied to a thyristors for which a trigger timing is delayed, and this thyristor is broken. Therefore, a trigger timing for all the thyristors must be coincided. However, it is quite difficult to coincide a trigger timing for respective thyristors S-1, S-2 . . . S-n. Furthermore, if one thyristor is erroneously made conductive, excessive voltage is applied to the remaining thyristors and they are destroyed.

As depicted in FIG. 2, gate driving circuits D-1, D-2 . . . D-n are provided for respective thyristors S-1, S-2 . . . S-n. Since a high voltage is shared by a number of thyristors, potentials of the gate driving circuits D-1, D-2 . . . D-n are different to a large extent. Therefore, power supply sources as well as gate driving signals of the gate driving circuits have to be isolated. In this case, dielectric strength amounts to several tens kilovolts, and therefore a circuit construction becomes very complicated and an operational reliability might be decreased.

Since a high voltage of several tens kilovolts is applied also to the series arrangement of a plurality of thyristors, an oil insulation should be provided between the series arrangement of thyristors and a component such as a chassis. However, this results in large labor word and cost. Therefore, in the known switching circuits, it is impossible to attain a complete isolation and a reliable operation could not be performed.

SUMMARY OF THE INVENTION

The present invention has for its object to provide a novel and useful switching circuit for generating pulsed power, in which the above mentioned various problems of the known switching circuit including the series arrangement of a number of semiconductor switching devices can be removed or at least mitigated, no excessively high voltage is not applied to the semiconductor switching devices ever under a variation of trigger timing thereof and the switching devices can be prevented from being destroyed, and no strict isolation is required between driving circuits for the semiconductor switching devices.

According to the invention, a switching circuit for generating pulsed power comprises:

first and second input terminals to be connected to a DC voltage supply source;

a plurality of capacitors whose one ends are connected commonly to said first input terminal and whose other ends are connected commonly to said second input terminal;

a plurality of magnetic cores;

a plurality of semiconductor switching devices each of which is connected in parallel with a respective one of the capacitors by means of a respective one of a plurality of primary conductors each being magnetically coupled with a respective one of said plurality of magnetic cores;

a plurality of driving circuits for controlling turn-on and turn-off of said plurality of semiconductor switching devices, respectively;

a series arrangement of a plurality of secondary conductors each being magnetically coupled with respective magnetic cores; and first and second output terminals, both ends of said series arrangement of a plurality of secondary conductors being connected said first and second output terminals, respectively such that a sum of voltages induced in respective secondary conductors is applied across said first and second output terminals.

In the switching circuit for generating pulsed power according to the invention, a high voltage is not applied to each of the semiconductor switching devices, and therefore they can be effectively protected from breakdown although they do not have identical characteristics. Furthermore, since a same voltage is applied to all the semiconductor switching devices, no high voltage is applied to the driving circuits. Therefore, it is no more necessary to isolate power supply sources of the driving circuits as well as driving signals, and all the driving circuits may be energized by a same power supply source as well as a same driving signal. Moreover, the DC voltage supply source and capacitors are not necessarily formed by special ones for high voltage, and may be formed by conventional parts which can be available easily. In this manner, a cost of the switching circuit can be reduced.

In the switching circuit for generating pulsed power according to the invention, said each of said primary and secondary conductors is preferably wound on the magnetic core by one turn. Such a one-turn structure can be realized by simply passing the conductor through the magnetic core. In this case, said series arrangement of secondary conductors is preferably formed by a single conductor passing through said plurality of magnetic cores successively. Since the secondary conductor is subjected to a high voltage, it is formed by a rather thick and thus rigid conductor. Therefore, it is advantageous to construct the secondary circuit only by passing the conductor through the magnetic cores successively. In this case, the secondary conductor is preferably straight.

Furthermore, in the switching circuit for generating pulsed power according to the invention, it is preferable to connect a plurality of diodes connected in parallel with respective primary conductors in an opposite polarity to that in which a current flows through the semiconductor switching devices. When turn-on timings in the semiconductor switching devices fluctuate, a rather high reverse voltage is induced in a primary conductor by means of the secondary conductor and is applied to a semiconductor switching device. Then, a diode is made conductive and the reverse voltage is not applied to the semiconductor switching device. The same function can be attained by connecting one electrodes of the semiconductor switching devices commonly.

Furthermore, in the switching circuit for generating pulsed power according to the present invention, it is preferable that each of said semiconductor switching device is formed by a static induction thyristor.

DESCRIPTION OF THE PREFERRED EMBODIMENTS

Now the present invention will be explained in detail with reference to several embodiments shown in the accompanying drawings.

Figure 1:
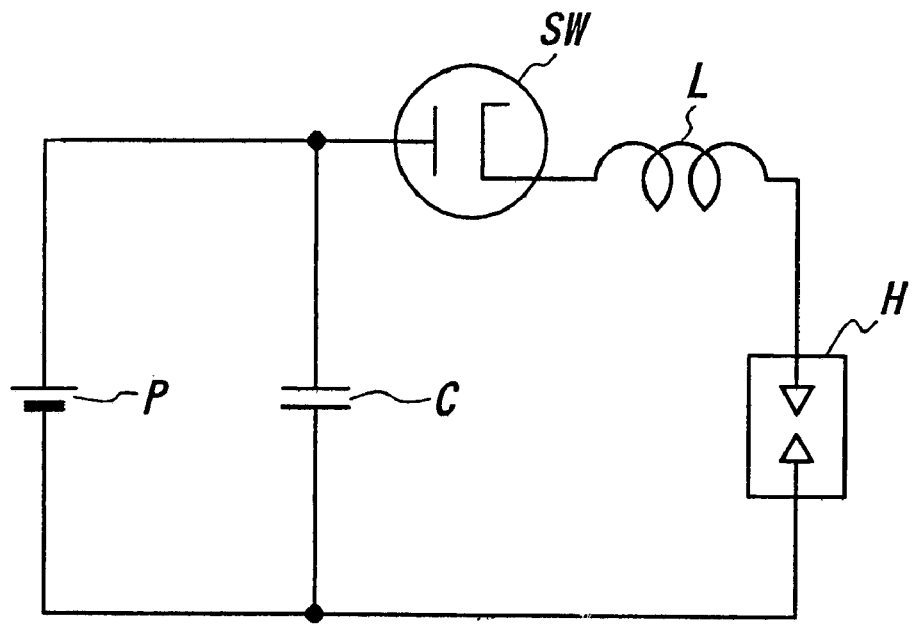
FIG. 1 is a circuit diagram showing a known switching circuit for generating pulsed power using a thyratron.
Figure 2:
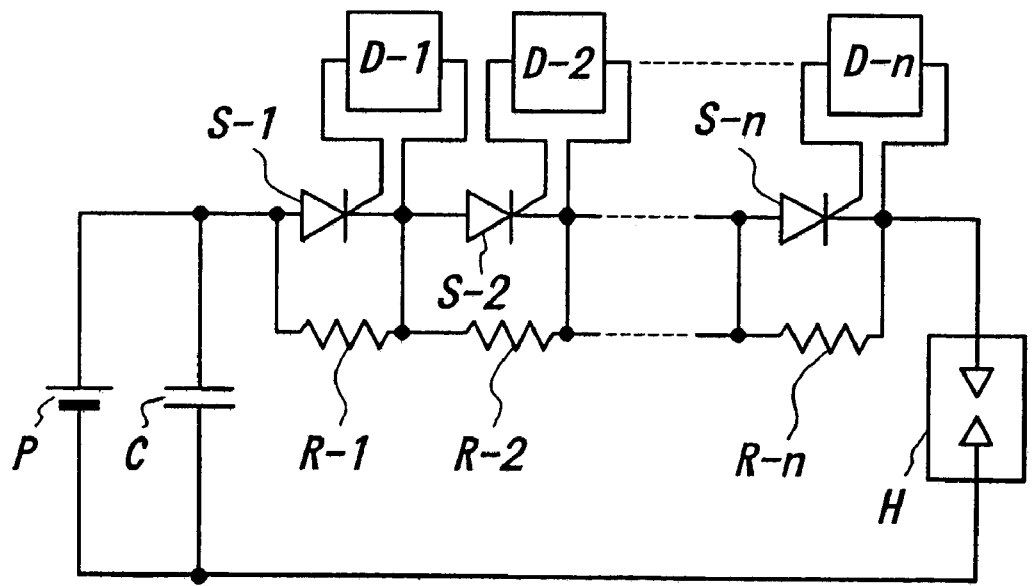
FIG. 2 is a circuit diagram illustrating a known switching circuit for generating pulsed power using a plurality of thyristors.
Figure 3:
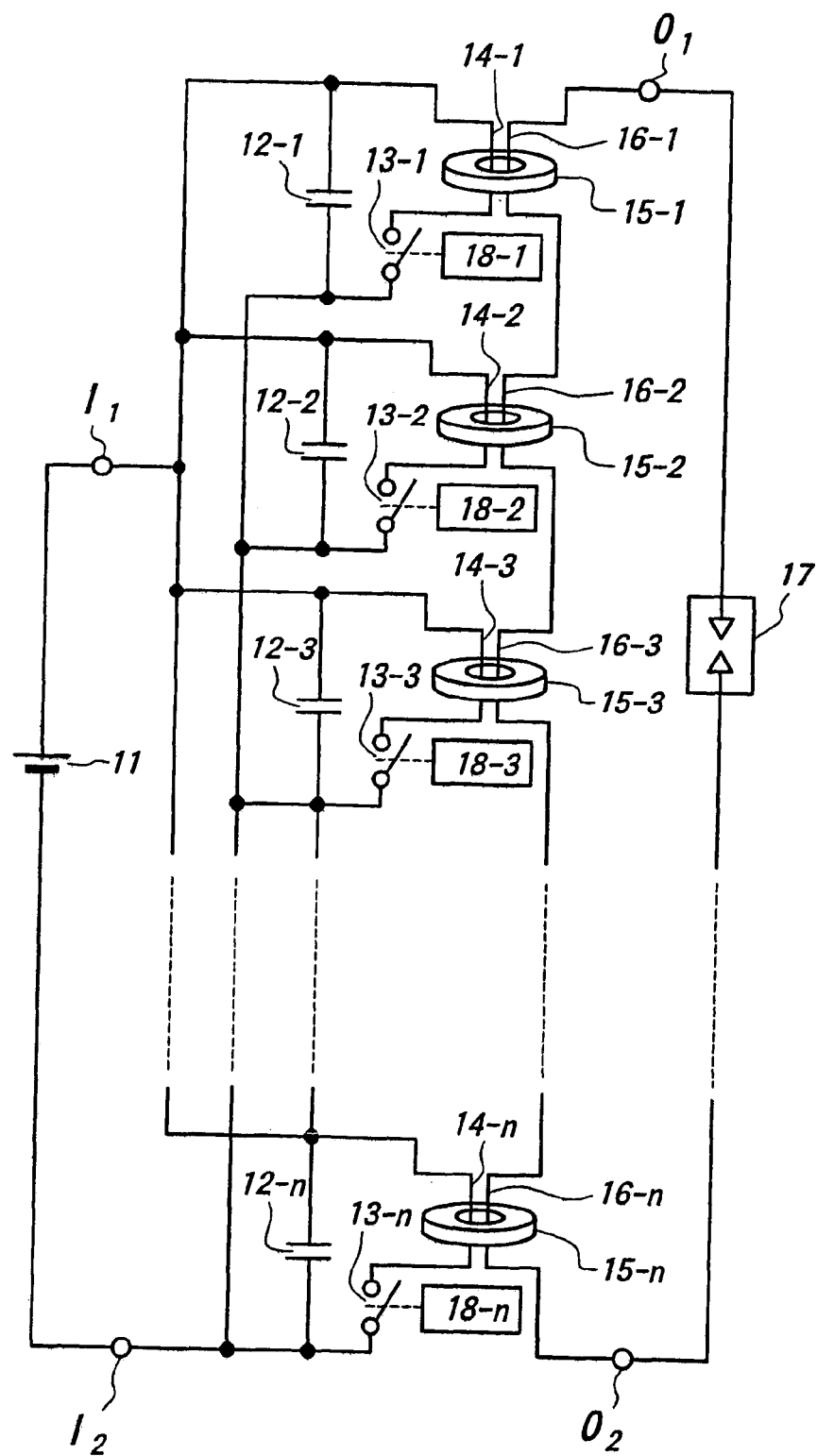
FIG. 3 is a circuit diagram depicting a basic structure of the switching circuit for generating pulsed power according to the invention.

FIG. 3 is a circuit diagram showing a principal structure of the switching circuit according to the invention. A first input terminal $I_1$ of the switching circuit is connected to a positive terminal of a DC voltage supply source 11 and a second input terminal $I_2$ is connected to a negative terminal of the voltage supply source 11. A plurality of capacitors 12-1, 12-2 . . . 12-n are connected in parallel with the DC voltage supply source 11. That is to say, one ends of the capacitors 12-1, 12-2 . . . 12-n are commonly connected to the first input terminal $I_1$ and the other ends of these capacitors are commonly connected to the second input terminal $I_2$. A series circuit of a semiconductor switching device 13-i(i=1, 2 . . . n) and a primary conductor 14-i(i=1, 2 . . . n) is connected in parallel with each capacitor 12-i(i=1, 2 . . . n). Each primary conductor 14-i(i=1, 2 . . . n) is magnetically coupled with each magnetic core 15-i(i=1, 2 . . . n). There are further provided a plurality of secondary conductors 16-1, 16-2 . . . 16-n, each of which is magnetically coupled with respective magnetic cores 15-1, 15-2 . . . 15-n. In this manner, each of the primary conductors 14-1, 14-2 . . . 14-n is magnetically coupled with respective one of the secondary conductors 16-1, 16-2 . . . 16-n by means of each of the magnetic cores 15-1, 15-2 . . . 15-n. According to the invention, a plurality of secondary conductors 16-1, 16-2 . . . 16-n are connected in series, and a series arrangement of the secondary conductors is connected across first and second output terminals $O_1$ and $O_2$. These output terminals $O_1$ and $O_2$ are connected to a discharge portion 17. The semiconductor switching devices 13-1, 13-2 . . . 13-n are controlled by driving circuits 18-1, 18-2 . . . 18-n, respectively.

The switching circuit for generating pulsed power according to the invention will operate as follows. At first, all the semiconductor switching devices 13-1, 13-2 . . . 13-n are turned-off to charge all the capacitors 12-1, 12-2 . . . 12-n are charged by the DC voltage supply source 11 simultaneously. By using a current restricting mechanism, this charging is performed relatively slowly. If an output voltage of the DC voltage supply source 11 is E, then the capacitors 12-1, 12-2 . . . 12-n are charged up to a voltage E. As explained later, when a required output voltage appearing across the first and second output terminals $O_1$ and $O_2$ is denoted by $E_0$, it is sufficient to construct the DC voltage supply source 11 to generate the output voltage $E=E_0/n$.

Next the driving circuits 18-1, 18-2 . . . 18-n are operated simultaneously to turn-on the semiconductor switching devices 13-1, 13-2 . . . 13-n to discharge charges stored in the capacitors 12-1, 12-2 . . . 12-n through the primary conductors 14-1, 14-2 . . . 14-n, respectively. Then, secondary voltages are induced in the secondary conductors 16-1, 16-2 . . . 16-n. Now it is assumed that in order to decrease a stray inductance induced by the primary and secondary conductors 14-1, 14-2 . . . 14-n and 16-1, 16-2 . . . 16-n, each of these conductors is wound on each of the magnetic cores 15-1, 15-2 . . . 15-n only by one turn. That is to say, the primary and secondary conductors are merely passed through the magnetic cores. In this case, a ratio of the primary and secondary windings becomes 1, and therefore the voltage E which is identical with the output voltage of the DC voltage supply source 11 is induced in each of the secondary conductors 16-1, 16-2 . . . 16-n. Since the secondary conductors 16-1, 16-2 . . . 16-n are connected in series, the voltages E induced in these conductors are summed up to produce a desired high output voltage n×E (=$E_0$) across the first and second output terminals $O_1$ and $O_2$.

In the switching circuit for generating pulsed power according to the invention, even if all the semiconductor switching devices 13-1, 13-2 . . . 13-n are not turned-on simultaneously due to fluctuations in their characteristics, an excessive high voltage is not applied to one or more non-conducting semiconductor switching devices. Furthermore, since the same voltage E is applied to all the semiconductor switching devices 13-1, 13-2 . . . 13-n, no high voltage is applied to the driving circuits 18-1, 18-2 . . . 18-3. Therefore, it is no more necessary to isolate power supply sources of these driving circuits as well as driving signals from each other. Moreover, it is sufficient to use the DC voltage supply source 11 generating a low output voltage and the capacitors 12-1, 12-2 . . . 12-n are not required to be formed to have a high breakdown voltage. In this manner, although the switching circuit according to the invention is somewhat complicated in its construction, respective circuit elements having lower breakdown voltages can be utilized without providing special isolation, and therefore the structure of the switching circuit as a whole becomes very simple and less expensive.

Figure 4:
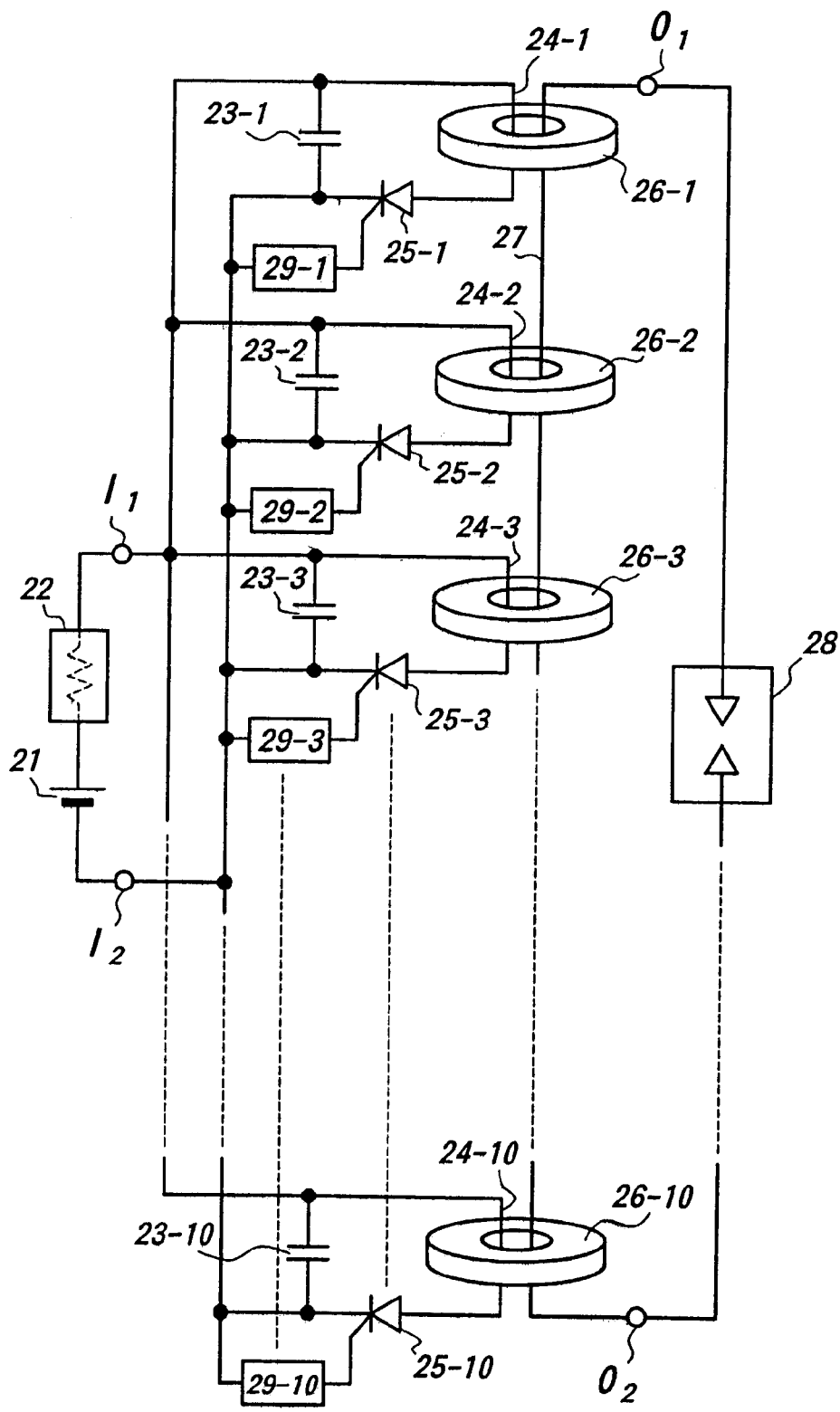
FIG. 4 is a circuit diagram showing a first embodiment of the switching circuit for generating pulsed power according to the invention.

FIG. 4 is a circuit diagram showing a first embodiment of the switching circuit for generating pulsed power according to the invention. In this embodiment, there are provided ten sets of capacitor, semiconductor switch, magnetic core and primary and secondary conductors (n=10). A current limiting resistor 22 is connected in series with a DC voltage supply source 21, and this series circuit is connected across the first and second input terminals $I_1$ and $I_2$. Ten capacitors 23-1, 23-2 . . . 23-10 are connected in parallel with the first and second input terminals 11 and $I_2$. In the present embodiment, the semiconductor switching device is formed by a static induction thyristor. One ends of the capacitors 23-1, 23-2 . . . 23-10 are connected through primary conductors 24-1, 24-2 . . . 24-10 to anodes of static induction thyristors 25-1, 25-2 . . . 25-10, respectively, and cathodes of the static induction thyristors are connected to the other ends of the capacitors 23-1, 23-2 . . . 23-10, respectively. The primary conductors 24-1, 24-2 . . . 24-10 are wound on magnetic cores 26-1, 26-2 . . . 26-10, respectively by one turn. A single insulated conductor 27 constituting a series arrangement of secondary conductors is passed through the magnetic cores 26-1, 26-2 . . . 26-10, successively, and both ends of the conductor 27 are connected to the first and second output terminals $O_1$ and $O_2$, respectively connected to a discharge portion 28. Between the cathodes and the gates of the static induction thyristors 25-1, 25-2 . . . 25-10, are connected gate driving circuits 29-1, 29-2 . . . 29-10, respectively.

The switching circuit of the present embodiment operates similarly to that of the principal structure shown in FIG. 3 and its detailed explanation is dispensed with. When the static induction thyristor has a breakdown voltage of several KV and the DC voltage supply source 21 produces the output voltage of several KV, a high voltage of several tens KV can be applied to the discharge portion 28. The DC voltage supply source 21 producing the output voltage of several KV can be constructed by conventional parts in a simple and less expensive manner, and a strict isolation such as the oil insulation is not required. Furthermore, the capacitors 23-1, 23-2 . . . 23-10 and thyristors 25-1, 25-2 . . . 25-10 can be formed to have a breakdown voltage of several KV, and can be small in size and less expensive in cost. Moreover, since the cathodes of all the thyristors 25-1, 25-2 . . . 25-10 are at a same potential, no high voltage is applied between the gate driving circuits 29-1, 29-2 . . . 9-10, and therefore it is no more necessary to isolate them mutually.

As stated above, in the switching circuit for generating pulsed power according to the invention, no high voltage is applied to a primary circuit portion, the isolation of the primary circuit portion from structural members such as chassis can be performed easily without providing special insulating means such as the oil insulation. Although a high voltage is applied to a secondary circuit portion, a plurality of the secondary conductors are formed by the single insulated conductor 27 which can be resist a high voltage and no problem occurs. When the secondary conductors are formed by the single straight conductor 27, a stray inductance can be minimized and high frequency characteristics can be improved.

Figure 5:
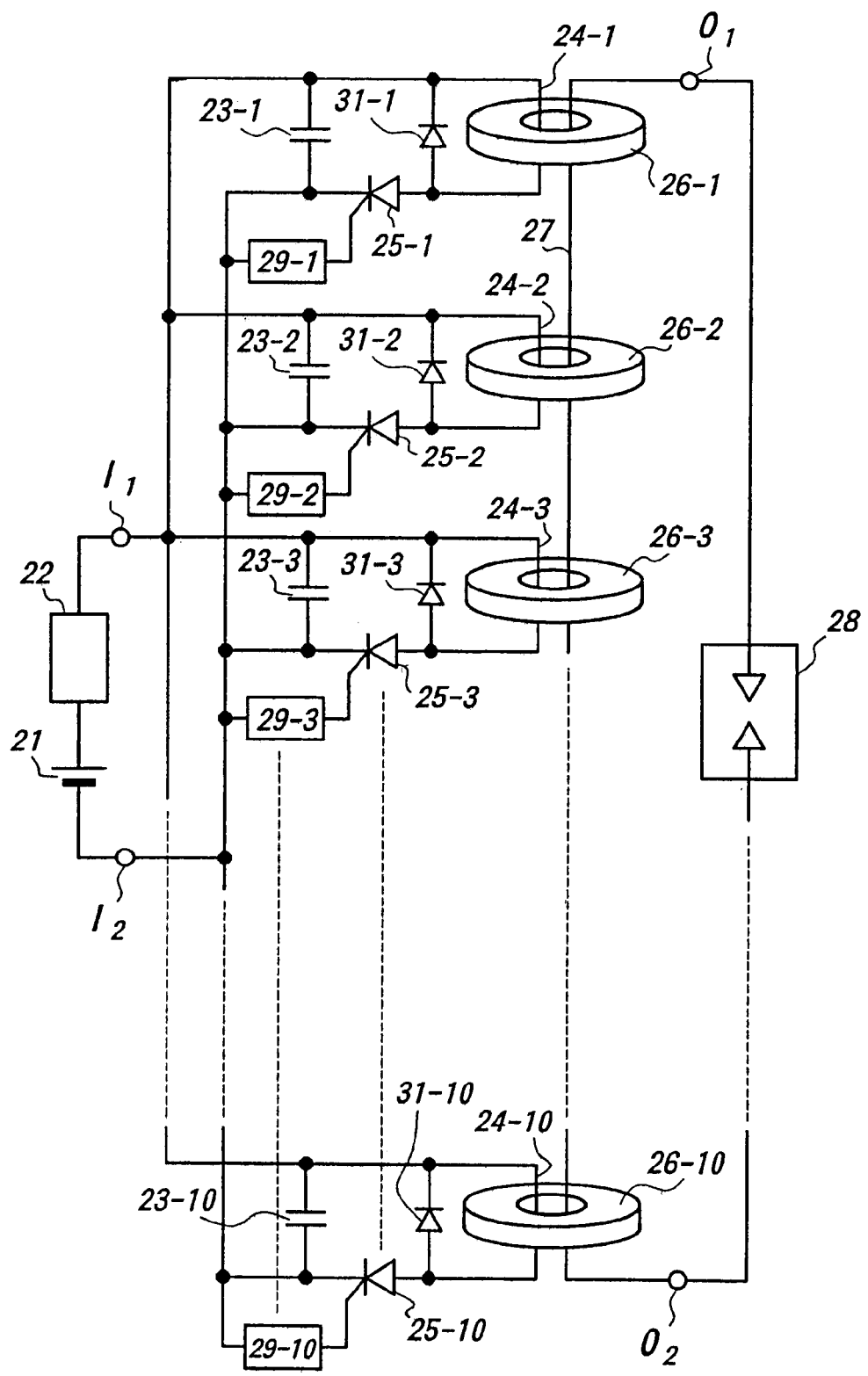
FIG. 5 is a circuit diagram depicting a second embodiment of the switching circuit for generating pulsed power according to the invention.

FIG. 5 is a circuit diagram depicting a second embodiment of the switching circuit for generating pulsed power according to the invention. In this embodiment, portions similar to those shown in FIG. 4 are denoted by the same reference numerals used in FIG. 4 and their explanation is omitted. In the present embodiment, diodes 31-1, 31-2 . . . 31-10 are connected in parallel with the primary conductors 24-1, 24-2 . . . 24-10, respectively in opposite polarity to the static induction thyristors 25-2, 25-2 . . . 25-10. That is to say, the anodes of the diodes 31-1, 31-2 . . . 31-10 are connected to the anodes of the thyristors 25-1, 25-2 . . . 25-10, respectively. When one of the thyristors, e.g. a thyristor 25-2 is not turned-on due to any reason, a reverse voltage is induced in the primary conductor 24-2 by the current flowing through the secondary conductor 27. If the diode is not provided, the reverse voltage is applied to the thyristor 25-2 and this thyristor might be broken. However, in the present embodiment, the reverse voltage is dissipated by the diode 31-2 and no high voltage is applied to the thyristor 25-2. The remaining merits of the switching circuit for generating pulsed power of the present embodiment are same as those of the first embodiment.

Figure 6:
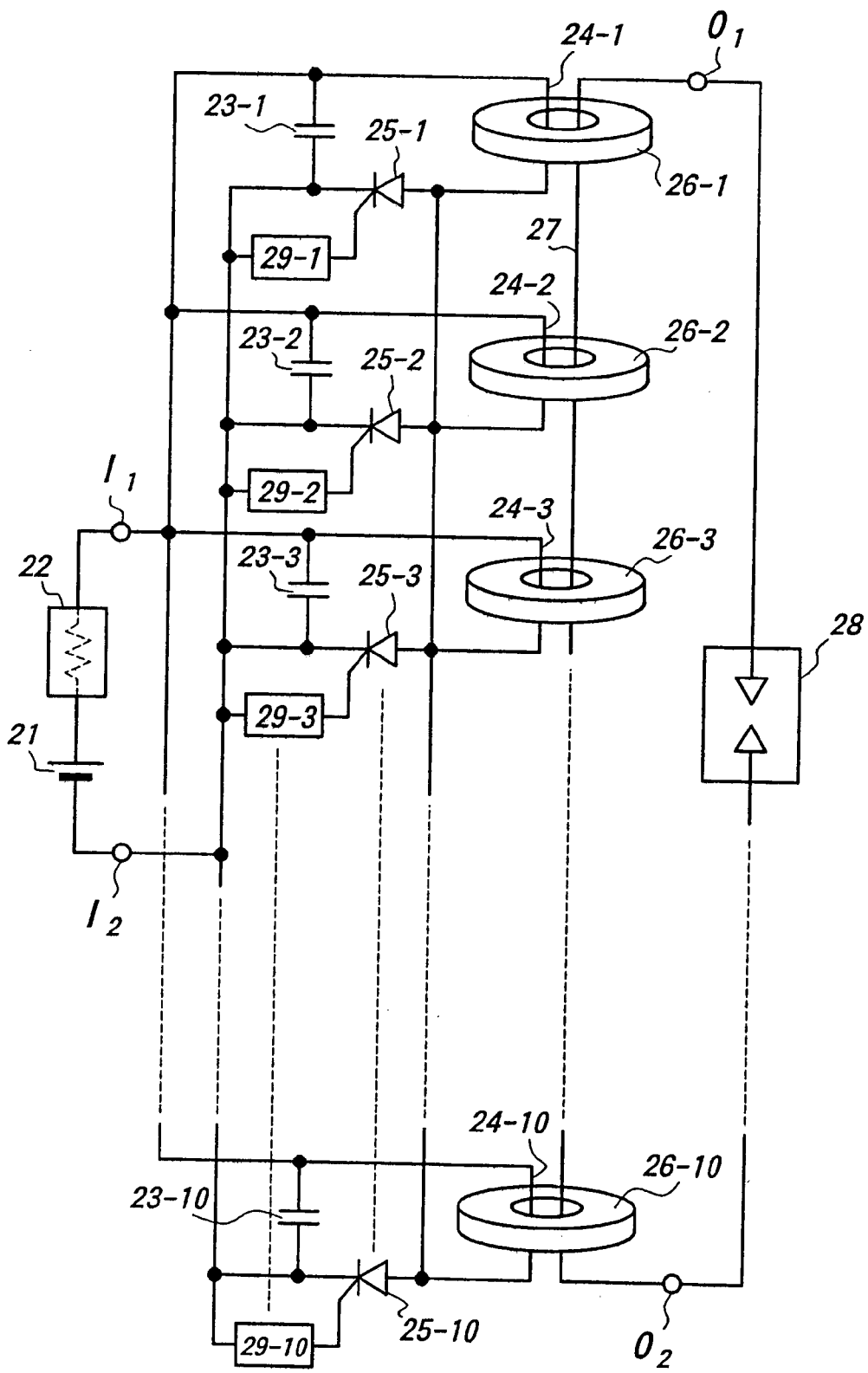
FIG. 6 is a circuit diagram illustrating a third embodiment of the switching circuit for generating pulsed power according to the invention

FIG. 6 is a circuit diagram showing a third embodiment of the switching circuit for generating pulsed power according to the invention. In this embodiment, portions similar to those of the first and second embodiments shown in FIGS. 4 and 5 are denoted by the same reference numerals used in FIGS. 4 and 5 and their explanation is dispensed with. In the present embodiment, the anodes of all the static induction thyristors 25-1,25-2 . . . 25-10 are connected to each other. If the thyristor 25-2 is not turned-on, the high reverse voltage induced in the primary conductor 24-2 is dissipated by the remaining turned-on thyristors and the thyristor can be protected against breakdown. Therefore, in the present embodiment, the diodes 31-1, 31-2 . . . 31-10 of the second embodiment can be deleted. The remaining merits of the present invention are identical with those of the first embodiment.

The present invention is not limited to the embodiments explained above, but many alternations and modifications may be conceived by a person skilled in the art within the scope of claims. For instance, in the above embodiments, the semiconductor switching device is formed by the static induction thyristor, but according to the invention, it may be constructed by other type thyristors and transistors. Furthermore, in the above explained embodiments, there are provided ten sets of the capacitor, thyristor, magnetic core and so on, but the number of the sets may be set at will taking into account of an output voltage of the DC voltage supply source and a required high voltage.

What is claimed is:

1. A switching circuit for generating pulsed power comprising:
    first and second input terminals to be connected to a DC voltage supply source;
    a plurality of capacitors whose one ends are connected commonly to said first input terminal and whose other ends are connected commonly to said second input terminal;
    a plurality of magnetic cores;
    a plurality of semiconductor switching devices each of which is connected in parallel with a respective one of the capacitors by means of a respective one of a plurality of primary conductors each being magnetically coupled with a respective one of said plurality of magnetic cores;
    a plurality of driving circuits for controlling turn-on and turn-off of said plurality of semiconductor switching devices, respectively;
    a series arrangement of a plurality of secondary conductors each being magnetically coupled with respective magnetic cores; and
    first and second output terminals, both ends of said series arrangement of a plurality of secondary conductors being connected said first and second output terminals, respectively such that a sum of voltages induced in respective secondary conductors is applied across said first and second output terminals.

2. The switching circuit according to claim 1, wherein said each of said primary and secondary conductors is passed through each of said magnetic cores once.

3. The switching circuit according to claim 2, wherein said series arrangement of secondary conductors is formed by a single conductor passing through said plurality of magnetic cores successively.

4. The switching circuit according to claim 1, further comprising a plurality of diodes connected in parallel with respective primary conductors in an opposite polarity to that in which a current flows through the semiconductor switching devices.

5. The switching circuit according to claim 1, wherein one ends of the semiconductor switching devices connected to respective primary conductors are connected commonly.

6. The switching circuit according to claim 1, wherein each of said semiconductor switching device is formed by a static induction thyristor.

7. The switching circuit according to claim 6, wherein said anodes of the static induction thyristors are commonly connected, through the primary conductors, respectively, to said first input terminal to be connected to a positive output terminal of the DC voltage supply source, cathodes of the static induction transistors are commonly connected to said second input terminal to be connected to a negative output terminal of the DC voltage supply source, and said control circuits are formed by gate driving circuits, each of which is connected between an anode and a cathode of a respective one of the static induction thyristors.

8. The switching circuit according to claim 7, wherein the anodes of said static induction thyristors are coupled with said first input terminal through parallel circuits of the primary conductors and diodes whose anodes are connected to the anodes of the static induction thyristors.

9. The switching circuit according to claim 7, wherein the anodes of said static induction thyristors are commonly connected.

10. The switching circuit according to claim 7, wherein a current limiting resistor is connected in a circuit for connecting said first and second input terminals to the DC voltage supply source.

11. The switching circuit according to claim 7, wherein said series arrangement of secondary conductors is formed by a single conductor.

12. The switching circuit according to claim 11, wherein said single conductor is straight.

* * * * *

UNITED STATES PATENT AND TRADEMARK OFFICE
CERTIFICATE OF CORRECTION

PATENT NO.    : 6,359,424 B2
DATED         : March 19, 2002
INVENTOR(S)   : Katsuji Iida, Tatsuhiko Hatano, Takeshi Sakuma and Wataru Shionoya It is certified that error appears in the above-identified patent and that said Letters Patent is hereby corrected as shown below:

<u>Column 8,</u>
Line 16, "an anode" should read -- a gate --.

Signed and Sealed this

Eighteenth Day of June, 2002

Attest:

Attesting Officer

JAMES E. ROGAN
*Director of the United States Patent and Trademark Office*